US010804120B2

(12) United States Patent
Ha et al.

(10) Patent No.: US 10,804,120 B2
(45) Date of Patent: Oct. 13, 2020

(54) TEMPERATURE CONTROLLER AND A PLASMA-PROCESSING APPARATUS INCLUDING THE SAME

(71) Applicant: SAMSUNG ELECTRONICS CO., LTD., Suwon-si, Gyeonggi-Do (KR)

(72) Inventors: Seong-Moon Ha, Seoul (KR); Min-Kyu Sung, Hwaseong-si (KR); Seung-Hee Cho, Hwaseong-si (KR); Seong-Chul Choi, Suwon-si (KR); Kyung-Sun Kim, Suwon-si (KR); Sang-Ho Lee, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 412 days.

(21) Appl. No.: 15/652,345

(22) Filed: Jul. 18, 2017

(65) Prior Publication Data
US 2018/0174869 A1 Jun. 21, 2018

(30) Foreign Application Priority Data

Dec. 21, 2016 (KR) .................. 10-2016-0175643

(51) Int. Cl.
*H01L 21/67* (2006.01)
*H01J 37/32* (2006.01)
*C23C 16/44* (2006.01)

(52) U.S. Cl.
CPC .... *H01L 21/67069* (2013.01); *C23C 16/4411* (2013.01); *H01J 37/32458* (2013.01); *H01J 37/32522* (2013.01); *H01L 21/67248* (2013.01); *H01L 21/67253* (2013.01); *H01J 37/32091* (2013.01); *H01J 37/32357* (2013.01); *H01J 37/32477* (2013.01); *H01J 37/32495* (2013.01); *H01J 2237/002* (2013.01)

(58) Field of Classification Search
CPC ........ H01L 21/67069; H01L 21/67253; H01L 21/67048; H01L 21/67248; H01J 37/32522; H01J 2237/24507; H01J 2237/002; H01J 37/32091; H01J 37/32532; H01J 37/32495; H01J 37/32477; H01J 37/32357; H01J 37/32935; H01J 37/3299; C23C 16/4411
See application file for complete search history.

(56) References Cited

U.S. PATENT DOCUMENTS

| 8,444,926 B2 | 5/2013 | Fodor et al. |
| 8,597,462 B2 | 12/2013 | Brown et al. |
| 8,864,932 B2 | 10/2014 | Furuya |
| 9,295,181 B2 | 3/2016 | Campbell et al. |
| 2005/0230350 A1* | 10/2005 | Kao ............... H01J 37/32522 216/67 |

(Continued)

FOREIGN PATENT DOCUMENTS

| JP | 1993-029225 | 2/1993 |
| JP | 2006-066292 | 3/2006 |

*Primary Examiner* — Rakesh K Dhingra
*Assistant Examiner* — Laureen Chan
(74) *Attorney, Agent, or Firm* — F. Chau & Associates, LLC (57) ABSTRACT

A temperature controller of a plasma-processing apparatus including a heating unit and a cooling unit. The heating unit is configured to heat a liner on an inner surface of a plasma chamber in which a plasma is formed. The cooling unit is configured to cool the liner to controls a temperature of an upper electrode in the plasma chamber.

20 Claims, 6 Drawing Sheets

(56) References Cited

U.S. PATENT DOCUMENTS

| | | | |
|---|---|---|---|
| 2005/0241766 A1* | 11/2005 | Dhindsa | H01J 37/32009 156/345.34 |
| 2007/0240979 A1* | 10/2007 | Nozawa | C23C 16/4404 204/298.01 |
| 2008/0178797 A1* | 7/2008 | Fodor | C23C 16/46 118/75 |
| 2009/0044752 A1* | 2/2009 | Furuya | C23C 16/45572 118/723 E |
| 2011/0024048 A1 | 2/2011 | Nakamura et al. | |
| 2011/0061810 A1* | 3/2011 | Ganguly | H01L 21/67207 156/345.27 |
| 2011/0220288 A1* | 9/2011 | Kobayashi | H01J 37/20 156/345.27 |
| 2012/0152914 A1* | 6/2012 | Matsuura | G03F 7/427 219/121.42 |
| 2013/0087286 A1* | 4/2013 | Carducci | H01J 37/32724 156/345.43 |
| 2013/0105085 A1* | 5/2013 | Yousif | H01L 21/20 156/345.37 |
| 2015/0007770 A1* | 1/2015 | Chandrasekharan | C23C 16/45565 118/715 |
| 2017/0342561 A1* | 11/2017 | Lin | H01J 37/32541 |

* cited by examiner

TEMPERATURE CONTROLLER AND A PLASMA-PROCESSING APPARATUS INCLUDING THE SAME

CROSS-REFERENCE TO RELATED APPLICATION

This application claims priority under 35 U.S.C. § 119 to Korean Patent Application No. 10-2016-0175643 filed on Dec. 21, 2016 in the Korean Intellectual Property Office (KIPO), the disclosure of which is incorporated by reference herein in its entirety.

TECHNICAL FIELD

Exemplary embodiments of the present inventive concept relate to a temperature controller, and more particularly to a plasma-processing apparatus including the same.

DISCUSSION OF RELATED ART

A plasma-processing apparatus may be configured to etch a layer on a semiconductor substrate, for example, by using plasma. Alternatively, a plasma-processing apparatus may be configured to form a layer on the semiconductor substrate, for example, by using plasma. The plasma-processing apparatus may include a plasma chamber, a substrate-supporting unit, an upper electrode assembly, a liner, and a temperature controller. The temperature controller may maintain a temperature of the upper electrode assembly. The liner may be arranged on an inner surface of the plasma chamber, for example, to reduce or prevent damage to the inner surface of the plasma chamber.

The temperature controller might not be interlocked with a power of the plasma in the plasma chamber. Thus, the temperature of the upper electrode assembly might not be maintained. Thus, an inner temperature of the plasma chamber may be different than a set process temperature. Accordingly, errors in a plasma-processing process may occur.

SUMMARY

Exemplary embodiments of the present inventive concept provide a temperature controller. The temperature controller may be operated with a power of plasma, for example, to accurately control a temperature of an upper electrode.

Exemplary embodiments of the present inventive concept also provide a plasma-processing apparatus including the temperature controller.

Exemplary embodiments of the present inventive concept provide a temperature controller of a plasma-processing apparatus. The temperature controller may include a heating unit and a cooling unit. The heating unit may be configured to heat a liner on an inner surface of a plasma chamber in which plasma may be formed. The cooling unit may be configured to cool the liner to control a temperature of an upper electrode in the plasma chamber. The cooling unit may comprise a controlling unit configured to detect a power of the plasma and to adjust an opening angle of the three-way valve in accordance with the detected power of the plasma. The cooling unit may comprise a controlling unit configured to detect the power of the plasma and to adjust an opening angle of the three-way valve corresponding to the detected power of the plasma.

Exemplary embodiments of the present inventive concept provide a plasma-processing apparatus. The plasma-processing apparatus may include a plasma chamber, a substrate-supporting unit, a shutter, an upper electrode assembly, a liner, a lid, a first temperature controller, and a second temperature controller. The plasma chamber may define a space in which a plasma may be formed. The substrate-supporting unit may be disposed in a lower region of the plasma chamber. The substrate-supporting unit may be configured to support a substrate. The shutter may be disposed at a sidewall of the plasma chamber. The shutter may be configured to transfer the substrate transferred through the shutter. The upper electrode assembly may be disposed in an upper region of the plasma chamber. The liner may be disposed on an inner surface of the plasma chamber. The lid may be configured to at least partially cover the liner. The first temperature controller may be configured to control a temperature of the upper electrode assembly. The second temperature controller may be configured to control a temperature of the liner to control a temperature of the upper electrode assembly.

Exemplary embodiments of the present inventive concept provide a plasma-processing apparatus. The plasma-processing apparatus may include a plasma chamber, a liner, an upper electrode, a temperature controller, a heating unit, and a cooling unit. A plasma may be injected into the plasma chamber. The liner may be disposed on an inner surface of the plasma chamber. The upper electrode assembly may be disposed in the plasma chamber. The temperature controller may be configured to control a temperature of the upper electrode assembly. The temperature controller may include a heating unit and a cooling unit. The heating unit may be configured to heat the liner. The cooling unit may be configured to reduce a temperature of the liner by using a power of the plasma. The reduced temperature of the liner controls a temperature of the upper electrode assembly. The cooling unit may comprise: a chiller configured to form a coolant; a main cooling passageway in the upper electrode assembly and connected to the chiller; a cooling passageway in the lid and connected to the main cooling passageway; a returning passageway connected to each of the cooling passageway and the chiller; a bypass passageway connected to each of the main cooling passageway and the returning passageway; a three-way valve configured to control an amount of the coolant supplied to the main cooling passageway and the bypass passageway in accordance with the power of the plasma; and a controlling unit configured to detect the power of the plasma and to adjust an opening angle of the three-way valve in accordance with the detected power of the plasma.

DETAILED DESCRIPTION OF THE EMBODIMENTS

Figure 1:
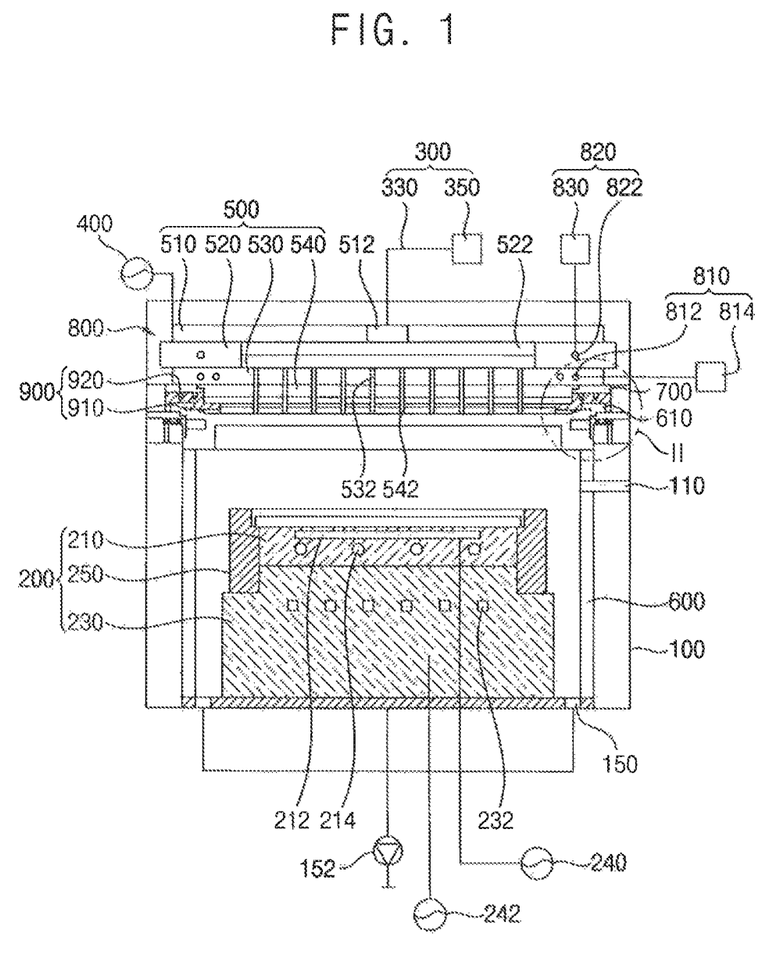
FIG. 1 is a cross-sectional view illustrating a plasma-processing apparatus according to an exemplary embodiment of the present inventive concept.
Figure 2:
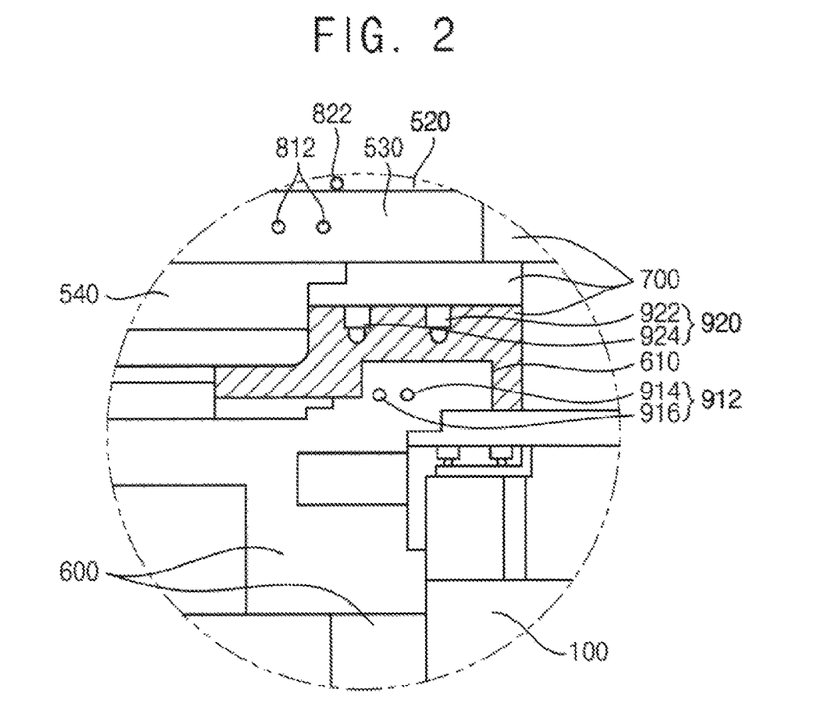
FIG. 2 is an enlarged cross-sectional view of a portion II of FIG. 1 according to an exemplary embodiment of the present inventive concept.
Figure 3:
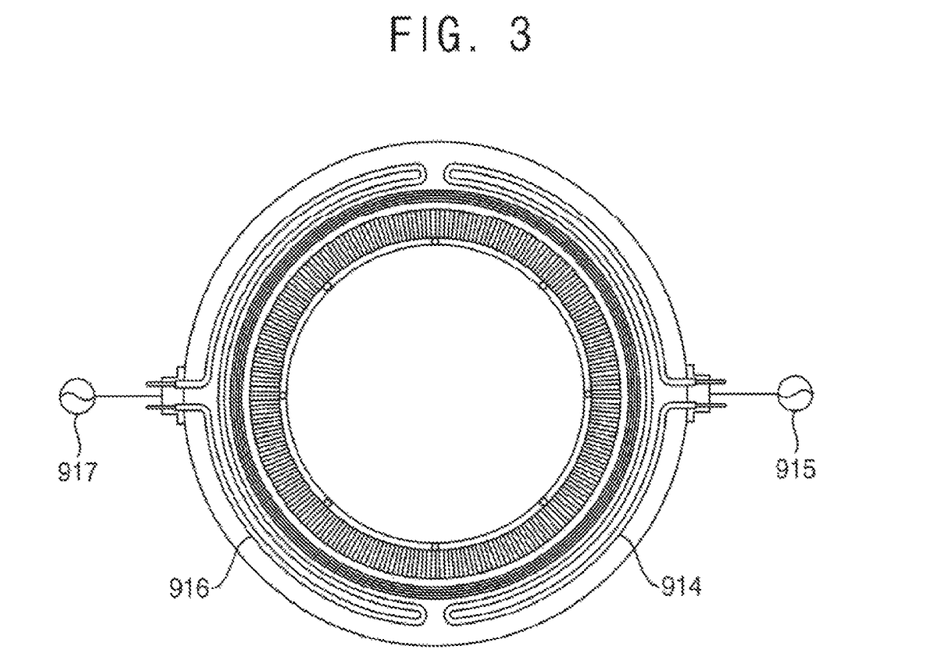
FIG. 3 is a cross-sectional view illustrating a heating unit of a liner of FIG. 2 according to an exemplary embodiment of the present inventive concept.
Figure 4:
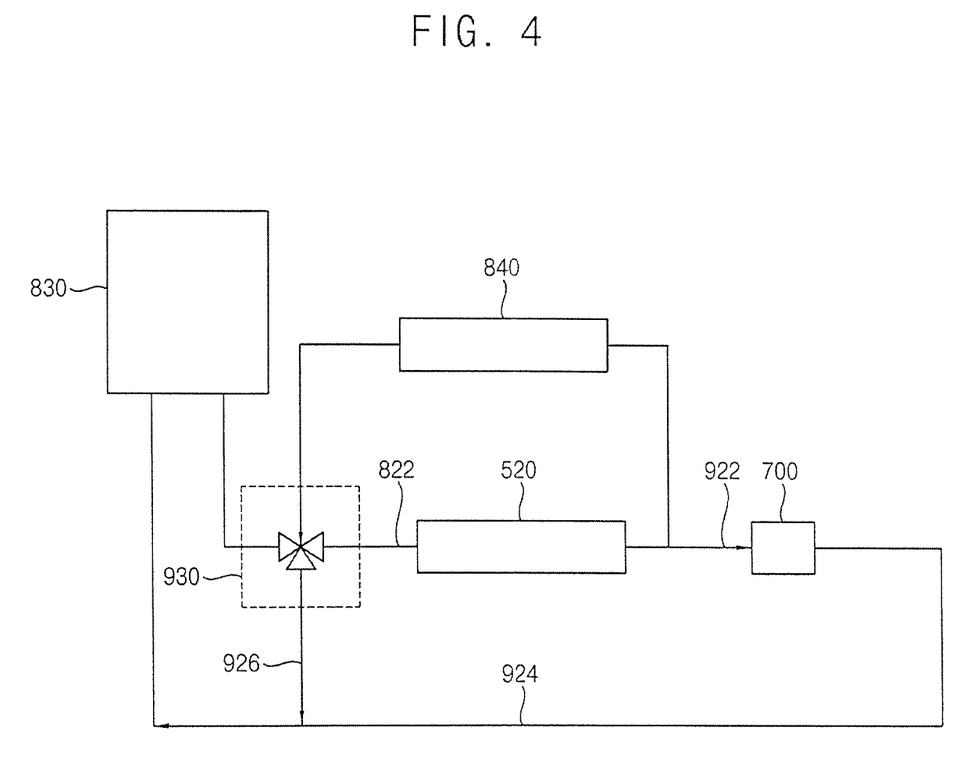
FIG. 4 is a block diagram illustrating a cooling unit of a plasma-processing apparatus of FIG. 1 according to an exemplary embodiment of the present inventive concept.

FIG. 1 is a cross-sectional view illustrating a plasma-processing apparatus according to an exemplary embodiment of the present inventive concept. FIG. 2 is an enlarged cross-sectional view of a portion II of FIG. 1 according to an exemplary embodiment of the present inventive concept. FIG. 3 is a cross-sectional view illustrating a heating unit in a liner of FIG. 2 according to an exemplary embodiment of the present inventive concept. FIG. 4 is a block diagram illustrating a cooling unit of a plasma-processing apparatus of FIG. 1 according to an exemplary embodiment of the present inventive concept.

Referring to FIGS. 1 to 4, a plasma-processing apparatus may include a plasma chamber 100, a substrate-supporting unit 200, a gas-supplying unit 300, an upper electrode assembly 500, a liner 600, a lid 700, a first temperature controller 800, and a second temperature controller 900.

The plasma chamber 100 may be configured to receive a substrate. The substrate may include a semiconductor substrate, a glass substrate, etc. The plasma chamber 100 may have a cylindrical shape. Alternatively, the plasma chamber 100 may have other shapes such as a rectangular parallelepiped shape. The plasma chamber 100 may have an inner space. Plasma may be formed in the inner space of the plasma chamber 100.

The plasma chamber 100 may include a shutter 110. The shutter 110 may be formed at a sidewall of the plasma chamber 100. The substrate may be loaded and/or unloaded into and/or from the plasma chamber 100, for example, through the shutter 110. The plasma chamber 100 may include a metal. Alternatively, the plasma chamber 100 may include other materials.

The liner 600 may be arranged on an inner surface of the plasma chamber 100. The liner 600 may reduce or prevent damage to the inner surface of the plasma chamber 100, for example, due to a power of the plasma. The power of the plasma may be a radio frequency (RF) power of the plasma.

The liner 600 may include a flange 610. The flange 610 may be integrally formed with the liner 600. For example, the flange 610 may be integrally formed with an upper edge portion of the liner 600. A lower surface of the flange 610 may be integrally formed with an upper end of the sidewall of the plasma chamber 100.

The lid 700 may be configured to cover the plasma chamber 100 and the liner 600. The lid 700 may contact each of the upper end of the sidewall of the plasma chamber 100 and an upper surface of the flange 610. Thus, the flange 610 of the liner 600 may be disposed between the upper end of the sidewall of the plasma chamber 100 and the lid 700.

An exhaust port 150 may be formed at a lower surface of the plasma chamber 100. The exhaust port 150 may be connected to an exhaust pump 152, for example, through an exhaust duct. The exhaust pump 152 may provide a vacuum to the exhaust port 150, for example, through the exhaust duct. The vacuum, provided by the exhaust pump 152 may exhaust byproducts generated in a substrate-processing process and the plasma in the plasma chamber 100 from the plasma chamber 100.

The substrate-supporting unit 200 may be arranged on the lower surface of the plasma chamber 100. The substrate-supporting unit 200 may support the substrate. The substrate-supporting unit 200 may include an electrostatic chuck (ESC). Alternatively, the substrate-supporting unit 200 may include other structures such as a mechanical clamper.

When the substrate-supporting unit 200 includes the ESC, the substrate-supporting unit 200 may include a dielectric layer 210, a focus ring 250 and a base 230. The substrate may be disposed on an upper surface of the dielectric layer 210. Thus, the upper surface of the dielectric layer 210 may contact a lower surface of the substrate. The dielectric layer 210 may have a circular plate shape. The dielectric layer 210 may have a radius shorter than a radius of the substrate. The dielectric layer 210 may include a ceramic material.

A lower electrode 212 may be arranged in the dielectric layer 210. A power supply 240 may be connected to the lower electrode 212. The lower electrode 212 may receive an electrostatic force, for example, from the power supply 240. The electrostatic force received by the lower electrode 212 may affix the substrate to the dielectric layer 210. The lower electrode 212 may include a monopole electrode.

A heater 214 for may be arranged in the dielectric layer 210. The heater 214 may heat the substrate. The heater 214 may be arranged below the lower electrode 212. The heater 214 may include a spiral coil.

The base 230 may support the dielectric layer 210. The base 230 may be positioned below the dielectric layer 210. The base 230 may be combined with the dielectric layer 210. The base 230 may have a stepped upper surface. The stepped upper surface of the base 230 may have an edge portion and a central portion. The central portion may protrude from the edge portion. The central portion of the base 230 may have an area corresponding to an area of a lower surface of the dielectric layer 210.

A cooling passageway 232 may be formed in the base 230. A coolant may flow through the cooling passageway 232. The cooling passageway 232 may have a spiral shape.

The base 230 may be connected to a high frequency power supply 242. The high frequency power supply 242 may be disposed outside the plasma chamber 100. The high frequency power supply 242 may apply a power to the base 230. The power applied to the base 230 may induce the plasma in the plasma chamber 100 to move toward the base 230. The base 230 may include a metal material.

The focus ring 250 may be configured to concentrate the plasma on the substrate. The focus ring 250 may be arranged on an edge portion of the upper surface of the dielectric layer 210. The focus ring 250 may have an annular shape and may be configured to at least partially surround the substrate. The focus ring 250 may include silicon oxide. Alternatively, the focus ring 250 may include other materials such as silicon carbon.

The focus ring 250 may include a single ring. Alternatively, the focus ring 250 may include a plurality of rings. For example, the focus ring 250 may include an inner ring and an outer ring. The outer ring may at least partially surround the inner ring.

The gas-supplying unit 300 may supply a gas to the substrate. The substrate may be supported by the substrate-supporting unit 200. The gas-supplying unit 300 may include a gas tank 350 and a gas line 330. The gas tank 350 may store the gas. The gas line 330 may be connected to the plasma chamber 100.

The upper electrode assembly 500 may be arranged in an upper region of the plasma chamber 100. The upper electrode assembly 500 may include an upper electrode 510, a distribution plate 520, a gas-distributing plate 530, and a shower head 540.

The distribution plate 520 may be arranged below the upper electrode 510. The gas-distributing plate 530 may be arranged below the distribution plate 520. The showerhead 540 may be arranged on a lower surface of the gas-distributing plate 530. A power supply 400 may be connected with the upper electrode 510. The power supply 400 may apply the RF power to the upper electrode 510.

The gas-distributing plate 530 may include a heat-resisting layer 534. The heat-resisting layer 534 may be arranged on the lower surface of the gas-distributing layer 530. Thus, the heat-resisting layer 534 may contact an upper surface of the shower head 540. The heat-resisting layer 534 may include a polymer such as polytetrafluoroethylene (PTFE), polyimide, etc.

The upper electrode 510 may include a gas passageway 512. A gas line 330 may be connected to the gas passageway 512. The distribution plate 520 may include a gas-distributing passageway 522. The gas-distributing passageway 522 may be connected to the gas passageway 512. The gas-distributing plate 530 may include a gas-distributing groove 532. The gas-distributing groove 532 may be connected to the gas-distributing passageway 522. The shower head 540 may include a plurality of gas nozzles 542. The plurality of gas nozzles 542 may be connected to the gas-distributing groove 532, for example, to inject the gas into the plasma chamber 100.

The first temperature controller 800 may control a temperature of the upper electrode assembly 500. The first temperature controller 800 may include a first heating unit 810 and a first cooling unit 820.

The first heating unit 810 may include a first heater 812 and a power supply 814. The heater 812 may be arranged in the gas-distributing plate 530. The power supply 814 may supply a power to the first heater 812.

The first cooling unit 820 may include a main cooling passageway 822. The main cooling passageway 822 may be formed in the distribution plate 520. The main cooling passageway 822 may be connected to a chiller 830. The chiller 830 may generate a coolant.

During the plasma-processing process, the coolant may be supplied to the main cooling passageway 822, for example, to cool the upper electrode assembly 500. During a cleaning process, the coolant might not be supplied to the main cooling passageway 822. The cleaning process may be performed after the plasma-processing process.

When an additional plasma-processing process is performed after the cleaning process, the coolant may be supplied to the main cooling passageway 822. The coolant may have a relatively low temperature. However, the RF power might not reach to a set power. Thus, the second plasma-processing process may be performed when the temperature of the upper electrode assembly 500 is lower than the set temperature.

The first heater 812 may be stopped, for example, due to a relatively high temperature of the plasma in the plasma chamber 100. Thus, temperatures of the inner surface of the plasma chamber 100 and the liner 600 might not be controlled. Thus, an internal temperature of the plasma chamber 100 may be higher than the set temperature.

The second temperature controller 900 may control the temperature of the liner 600, for example, corresponding to the power of the plasma. The second temperature controller 900 may include a second heating unit 910 and a second cooling unit 920.

The second heating unit 910 may include a second heater 912. The second heater 912 may heat the liner 600. The second heater 912 may be positioned in a flange 610 of the liner 600. Alternatively, the liner 600 may have a thickness for receiving the second heater 912. Thus, the second heater 912 may be arranged in the liner 600.

The second heater 912 may include a first heating coil 914 and a second heating coil 916. A first power supply 915 may supply a power to the first heating coil 914. A second power supply 917 may supply a power to the second heating coil 916. Thus, the first heating coil 914 and the second heating coil 916 may be independently operated.

The liner 600 may include a first portion and a second portion. The first portion of the liner 600 may be adjacent to the shutter 110. The substrate may be transferred through the shutter 110. The second portion may be spaced apart from the shutter 110. Because the first portion of the liner 600 may be adjacent to the shutter 110, a temperature variation in the first portion of the liner 600 may be relatively larger than a temperature variation in the second portion of the liner 600.

The first heating coil 914 may be arranged in the first portion of the liner 600, (e.g., the first portion of the flange 610), for example, to heat the first portion. The second heating coil 916 may be arranged in the second portion of the liner 600 (e.g., the second portion of the flange 610), for example, to heat the second portion.

According to exemplary embodiments of the present inventive concept, the first portion of the liner 600 may be a half of the liner 600. The second portion of the liner 600 may be the other half of the liner 600. Thus, the first heating coil 914 and the second heating coil 916 may each have a semi-annular shape. However, the first portion and the second portion of the liner 600 may vary, for example, in accordance with positions, sizes, operating periods, etc., of the shutter 110. Thus, the shapes of the first and second heating coils 914 and 916 may also be changed in accordance with the positions, the sizes, the operating periods, etc., of the shutter 110. Further, the liner 600 may be divided into at least three portions. Thus, an amount of the heating coils may correspond to an amount of the portions of the liner 600.

The second cooling unit 920 may cool the liner 600 in accordance with the power of the plasma. The second cooling unit 920 may include a cooling passageway 922 and a returning passageway 924.

The cooling passageway 922 may be formed in the lid 700. The cooling passageway 922 may be connected to the main cooling passageway 822 in the distribution plate 520. Thus, the coolant in the chiller 830 may be supplied to the cooling passageway 922, for example, through the main cooling passageway 822. The coolant in the chiller 830 may cool the lid 700 and the liner 600. Thus, the liner 600 may be indirectly cooled by cooling the lid 700. Alternatively, the cooling passageway 922 may be connected to a chiller separated from the cooling passageway 922.

The returning passageway 924 may be connected to each of the cooling passageway 922 and the chiller 830. For example, the returning passageway 924 may be disposed between the cooling passageway 922 and the chiller 830. The coolant may be returned to the chiller 830, for example, through the returning passageway 924. The coolant may cool the lid 700.

A bypass passageway 926 may be connected to each of the main cooling passageway 822 and the returning passageway 924. For example, the bypass passageway 926 may be disposed between the cooling passageway 822 and the returning passageway 924. Thus, at least a portion of the coolant passing through the main cooling passageway 822 may be returned to the chiller 830 through the bypass passageway 926.

A three way valve 930 may be disposed on the main cooling passageway 822. The three way valve 930 may selectively control amounts of the coolant passing through the main cooling passageway 822 and the bypass passageway 926 in accordance with the power of the plasma.

A controlling unit 840 may be configured to detect the power of the plasma (e.g., the RF power applied to the upper electrode assembly 500). The controlling unit 840 may adjust opening angles of the three way valve 930 in accordance with the detected power of the plasma.

For example, when the power of the plasma is less than the set power, the upper electrode assembly 500, the lid 700 and the liner 600 may not have to be cooled. Thus, the controlling unit 840 may decrease the opening angle of the three way valve 930 toward the upper electrode assembly 500. Alternatively, the controlling unit 840 may shut the three-way valve 930. The controlling unit 840 may increase the opening angle of the three-way valve 930 toward the bypass passageway 926. Therefore, the amount of the coolant supplied to the upper electrode assembly 500 may be reduced. In this case, a relatively large portion of the coolant may be returned to the chiller 830 through the bypass passageway 926.

When the power of the plasma reaches the set power, the controlling unit 840 may decrease the opening angle of the three way valve 930. Alternatively, the controlling unit 840 may shut the three way valve 930 toward the bypass passageway 930. The controlling unit 840 may increase the opening angle of the three way valve 930 toward the upper electrode assembly 500. Therefore, the amount of the coolant supplied to the upper electrode assembly 500 may be increased. In this case, a relatively large portion of the coolant may be supplied to the upper electrode assembly 500 and the lid 700 through the main cooling passageway 822 and the cooling passageway 922.

Figure 5:
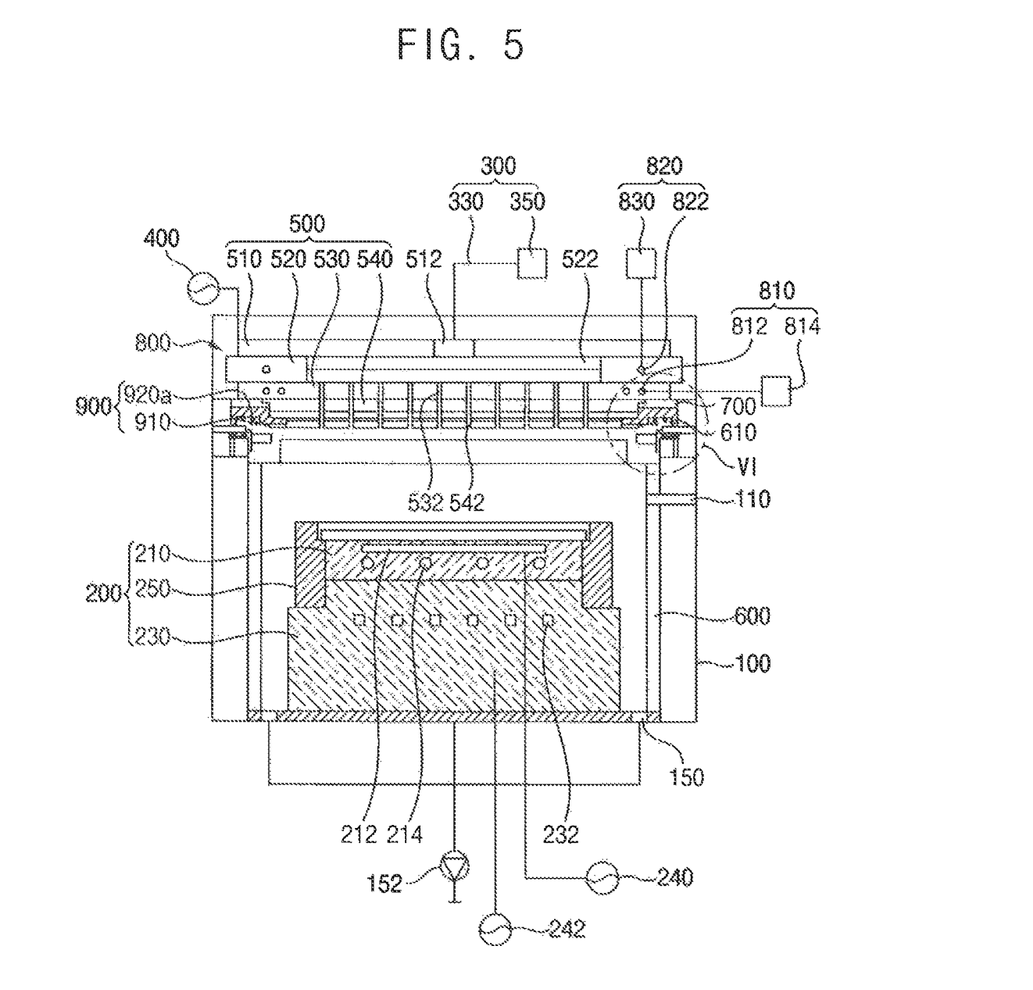
FIG. 5 is a cross-sectional view illustrating a plasma-processing apparatus according to an exemplary embodiment of the present inventive concept.
Figure 6:
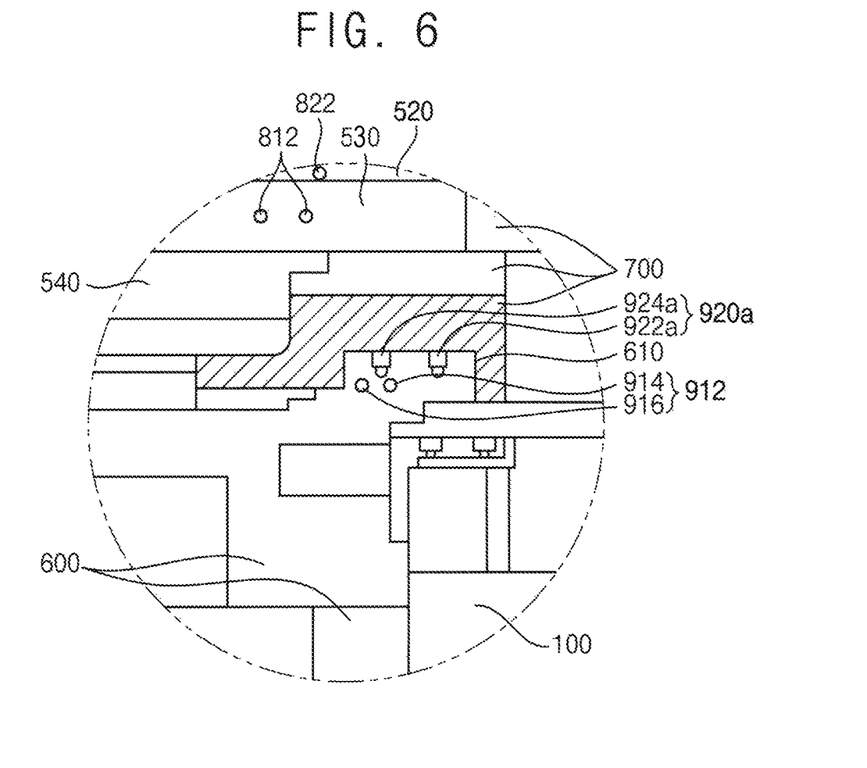
FIG. 6 is an enlarged cross-sectional view of a portion VI of FIG. 5 according to an exemplary embodiment of the present inventive concept.
Figure 7:
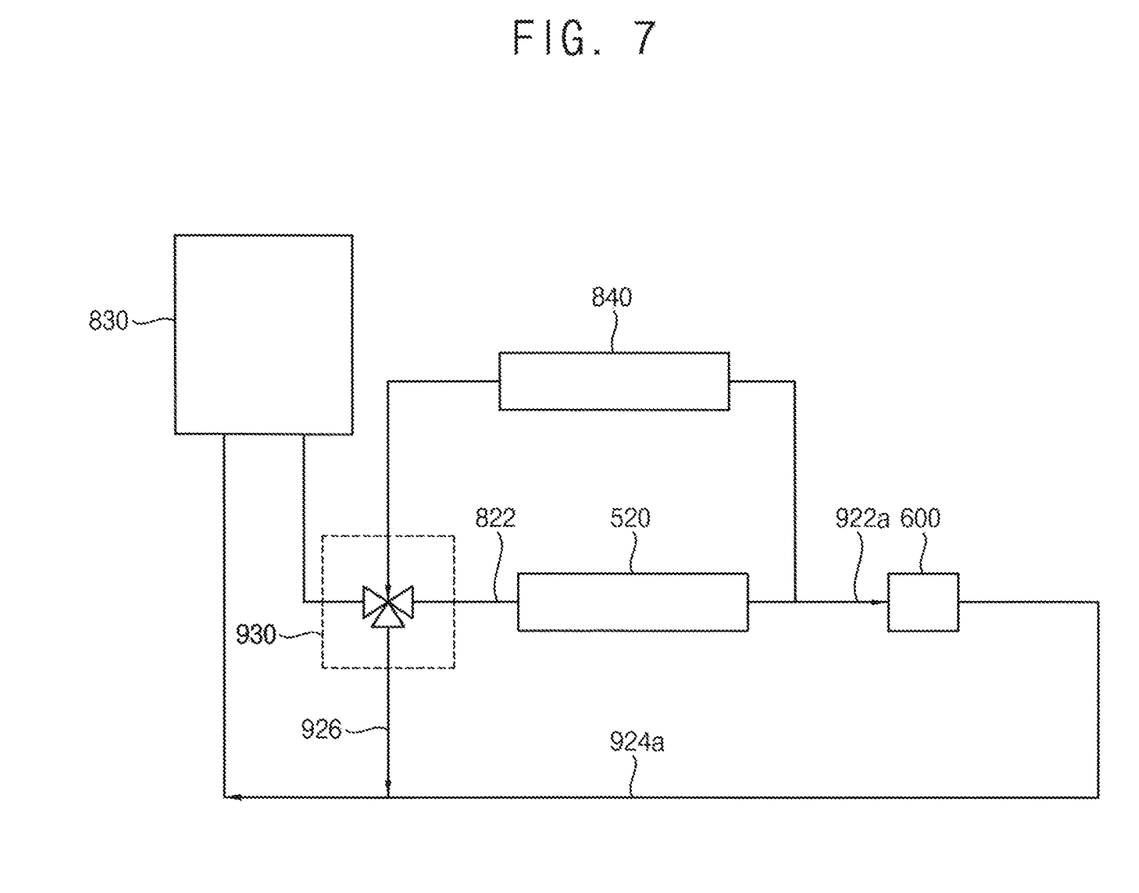
FIG. 7 is a block diagram illustrating a cooling unit of a plasma-processing apparatus of FIG. 5 according to an exemplary embodiment of the present inventive concept.

FIG. 5 is a cross-sectional view illustrating a plasma-processing apparatus according to an exemplary embodiment of the present inventive concept. FIG. 6 is an enlarged cross-sectional view of a portion VI of FIG. 5 according to an exemplary embodiment of the present inventive concept. FIG. 7 is a block diagram illustrating a cooling unit of a plasma-processing apparatus of FIG. 5 according to an exemplary embodiment of the present inventive concept.

A plasma-processing apparatus according to an exemplary embodiment of the present inventive concept may include elements substantially the same as the plasma-processing apparatus of FIG. 1 except for a second cooling unit of a second temperature controller. Thus, further description with respect to substantially the same elements may be omitted.

Referring to FIGS. 5 to 7, a cooling passageway 922*a* of a second cooling unit 920*a* may be formed in the liner 600. The cooling passageway 922*a* may be formed in the flange 610 of the liner 600. The second cooling unit 920*a* may include the cooling passageway 922*a* and a returning passageway 924*a*.

The cooling passageway 922*a* may be connected to the main cooling passageway 822 in the distribution plate 520. Thus, the coolant in the chiller 830 may be supplied to the cooling passageway 922*a* through the main cooling passageway 822. Thus, the coolant in the chiller 830 may cool the lid 700 and the liner 600. The liner 600 may be directly cooled by the coolant supplied to the cooling passageway 922*a* in the liner 600. Alternatively, the cooling passageway 922*a* may be connected to another chiller.

According exemplary embodiments of the present inventive concept, the temperature of the liner may be controlled in accordance with the power of the plasma. Thus, the temperature of the upper electrode may be maintained at a process temperature. Therefore, a plasma-processing process using the plasma-processing apparatus may be accurately performed. For example, the plasma-processing process may be accurately performed in accordance with recipes.

The foregoing is illustrative of exemplary embodiments of the present inventive concept and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the following claims.

What is claimed is:

1. A temperature controller of a plasma processing apparatus, the temperature controller comprising:
 a heater disposed in a liner on an inner surface of a plasma chamber in which a plasma is formed;
 a cooler having a chiller comprising a fluidic coolant, a main cooling passageway disposed in an upper electrode of the plasma chamber, and another cooling passageway disposed apart from the upper electrode, wherein the main cooling passageway is connected between the chiller and the other cooling passageway; and
 a three-way valve connected to the other cooling passageway and configured to control an amount of the coolant supplied thereto, wherein the three-way valve is disposed on the main cooling passageway,
 wherein a temperature of the liner is used to control a temperature of the upper electrode.

2. The temperature controller of claim 1, wherein the heater is configured to heat a flange, wherein the flange is extended from an edge of an upper end of the liner and is disposed between an upper end of a sidewall of the plasma chamber and a lid, wherein the lid is configured to overlap the liner.

3. The temperature controller of claim 2, wherein the heater comprises:
 a first heater arranged in a first portion of the flange adjacent to a shutter; and
 a second heater arranged in a second portion of the flange.

4. The temperature controller of claim 1, wherein the other cooling passageway is disposed in a lid overlapping the liner.

5. The temperature controller of claim 4, wherein the cooler further comprises:
 a returning passageway connected between the other cooling passageway and the chiller; and
 a bypass passageway connected between the other cooling passageway and the returning passageway,
 wherein the three-way valve is further configured to control an amount of the coolant supplied to the bypass passageway,
 wherein the cooler cools the liner through the lid.

6. The temperature controller of claim 5, wherein the temperature controller is configured to detect a power of the plasma and to adjust an opening angle of the three-way valve in accordance with the detected power of the plasma.

7. The temperature controller of claim 1, wherein the other cooling passageway is disposed in the liner.

8. The temperature controller of claim 7, wherein the cooler further comprises:
a returning passageway connected between the liner and the chiller; and
a bypass passageway connected between the other cooling passageway and the returning passageway,
wherein the three-way valve is further configured to control an amount of the coolant supplied to the bypass passageway,
wherein the other cooling passageway disposed in the liner directly cools the liner.

9. The temperature controller of claim 8, wherein the temperature controller is configured to detect a power of the plasma and to adjust an opening angle of the three-way valve corresponding to the detected power of the plasma.

10. The temperature controller of claim 1, wherein the cooler cools the liner in accordance with a power of the plasma.

11. A plasma-processing apparatus, comprising:
a plasma chamber defining a space in which a plasma is formed;
a chuck disposed in a lower region of the plasma chamber, and configured to support a substrate;
a shutter disposed at a sidewall of the plasma chamber, wherein the substrate passes through the shutter;
an upper electrode assembly having an upper electrode disposed in an upper region of the plasma chamber;
a main cooling passageway in the upper electrode assembly;
another cooling passageway disposed apart from the upper electrode assembly and connected to the main cooling passageway;
a liner disposed on an inner surface of the plasma chamber;
a lid configured to at least partially cover the liner;
a first temperature controller comprising the main cooling passageway and configured to control a temperature of the upper electrode assembly; and
a second temperature controller comprising the other cooling passageway and configured to control a temperature of the liner to control a temperature of the upper electrode assembly,
wherein the other cooling passageway is disposed in at least one of the liner or the lid.

12. The plasma-processing apparatus of claim 11, wherein the second temperature controller comprises:
a heater disposed in the liner; and
a cooler configured to reduce a temperature of the liner in accordance with a power of the plasma.

13. The plasma-processing apparatus of claim 12, wherein the heater comprises:
a first heater arranged in a first portion of a flange of the liner adjacent to the shutter;
a second heater arranged in a second portion of the flange spaced away from the shutter.

14. The plasma-processing apparatus of claim 12, wherein the cooler further comprises:
a chiller configured to chill a coolant, wherein the main cooling passageway in the upper electrode assembly is connected to the chiller;
a cooling passageway in the lid and connected to the main cooling passageway;
a returning passageway connected to each of the other cooling passageway and the chiller;
a bypass passageway connected to each of the main cooling passageway and the returning passageway; and
a three-way valve configured to control an amount of the coolant supplied to the main cooling passageway and the bypass passageway in accordance with the power of the plasma,
wherein the other cooling passageway is disposed in the lid,
wherein the second temperature controller is configured to detect the power of the plasma and to adjust an opening angle of the three-way valve in accordance with the detected power of the plasma.

15. A plasma-processing apparatus, comprising:
a plasma chamber, wherein a plasma is injected into the plasma chamber;
a liner disposed on an inner surface of the plasma chamber;
an upper electrode assembly disposed in the plasma chamber;
a main cooling passageway disposed in the upper electrode assembly;
another cooling passageway disposed apart from the upper electrode assembly;
a temperature controller configured to control a temperature of the upper electrode assembly, wherein the temperature controller comprises:
a heater configured to heat the liner; and
a cooler comprising the main cooling passageway and the other cooling passageway, and a chiller connected to at least one of the main cooling passageway or the other cooling passageway, wherein the main cooling passageway is connected to the other cooling passageway and wherein the cooler is configured to reduce a temperature of the liner by using a power of the plasma, wherein the temperature of the liner controls the temperature of the upper electrode assembly.

16. The plasma-processing apparatus of claim 15 further comprising a lid configured to at least partially cover the liner and the plasma chamber.

17. The plasma-processing apparatus of claim 15, wherein the heater is disposed in a flange extending from an edge of an upper end of the liner, the temperature controller further comprises a second heater disposed in the upper electrode assembly.

18. The plasma-processing apparatus of claim 15, further comprising a three-way valve disposed on the main cooling passageway.

19. The plasma-processing apparatus of claim 15, wherein the other cooling passageway is disposed in at least one of the liner or a lid disposed on the liner.

20. The plasma-processing apparatus of claim 11, wherein:
the first temperature controller comprises a first heater disposed in the upper electrode assembly,
the second temperature controller comprises a second heater disposed in the liner.

* * * * *